United States Patent [19]

Plus et al.

[11] Patent Number: 5,113,134
[45] Date of Patent: May 12, 1992

[54] INTEGRATED TEST CIRCUIT FOR DISPLAY DEVICES SUCH AS LCD'S

[75] Inventors: Dora Plus, South Bound Brook, N.J.; Bruno B. Mourey, Voiron, France

[73] Assignee: Thomson, S.A., Courbevoie, France

[21] Appl. No.: 660,275

[22] Filed: Feb. 28, 1991

[51] Int. Cl.⁵ .................. G01R 31/28; G01R 31/02
[52] U.S. Cl. ................... 324/158 R; 324/73.1; 340/765; 340/653
[58] Field of Search .............. 324/158 R, 73.1, 500, 324/537, 538; 371/15.1, 21.1, 22.6, 25.1, 22.4, 719, 784; 340/652, 653, 654, 660, 715, 765; 365/201

[56] References Cited

U.S. PATENT DOCUMENTS

| | | | |
|---|---|---|---|
| 4,297,692 | 10/1981 | Maier | 340/715 |
| 4,420,748 | 12/1983 | Jurgen | 340/765 |
| 4,701,695 | 10/1987 | Chan et al. | 324/537 |
| 4,734,688 | 3/1988 | Adams | 340/715 |
| 4,742,346 | 5/1988 | Gillette et al. | 340/767 |
| 4,766,430 | 8/1988 | Gillette et al. | 340/767 |
| 4,843,312 | 6/1989 | Hartman et al. | 250/310 |
| 4,870,357 | 9/1989 | Young et al. | 358/106 |
| 4,899,105 | 2/1990 | Akiyama | 324/158 F |
| 5,057,775 | 10/1991 | Hall | 324/158 R |

*Primary Examiner*—Vinh Nguyen
*Attorney, Agent, or Firm*—J. S. Tripoli; D. H. Irlbeck; L. L. Hallacher

[57] ABSTRACT

A circuit for testing a liquid crystal display for open data lines, for identifying select lines shorted to data lines, and for identifying failed data line scanner stages includes thin film transistors arranged between each data line and a segmented bus. A sectioned shift register sequentially actuates the thin film transistors and the bus segments are monitored while data signals are applied to the data lines. The absence of a voltage on the bus indicates an open data line. The bus is also monitored while select signals are applied to the select lines and the shift register sequentially actuates the thin film transistors, the presence of a voltage on the bus indicates a short between a data line and a select line.

9 Claims, 1 Drawing Sheet

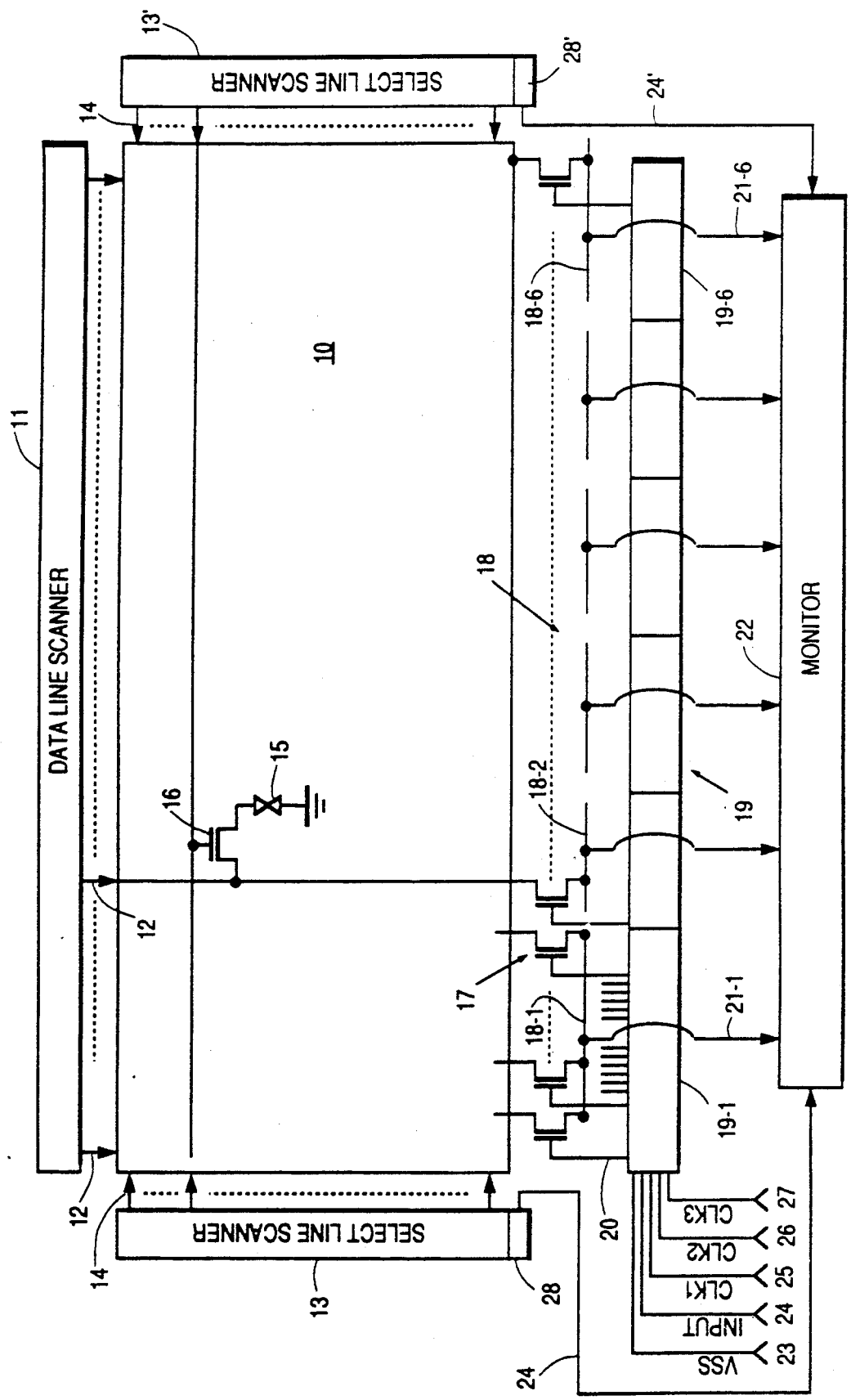

INTEGRATED TEST CIRCUIT FOR DISPLAY DEVICES SUCH AS LCD'S

BACKGROUND

This invention is directed to an integrated test circuit for display devices, particularly liquid crystal displays.

Liquid crystal television and computer displays are known in the art. For example, see U.S. Pat. Nos. 4,742,346 and 4,766,430, both issued to G. G. Gillette et al. and incorporated herein by reference. Displays of the type described in the Gillette patents include a matrix of liquid crystal cells which are arranged at the crossovers of data lines and select lines. The select lines are sequentially selected by a select line scanner to produce the horizontal lines of the display. The data lines apply the brightness (gray scale) signals to the columns of liquid crystal cells as the select lines are sequentially selected. Each liquid crystal cell is associated with a switching device through which a ramp voltage is applied to the liquid crystal cells in the selected line. Each of the switching devices is held on by a comparator, or a counter, which receives one of the brightness signals to permit the ramp voltage to charge the associated liquid crystal cell to a voltage proportional to the brightness level received by the comparator from the data line.

Liquid crystal displays for television and computer monitors have a large number of columns of liquid crystal cells, for example 1,440. Assuming substantially square liquid crystal cells and a standard television aspect ratio of 4×3, a display with 1,440 data lines would have approximately 1,080 select lines. In an acceptable display, none of this large number of lines can include an open. Also, the data lines and select lines are perpendicular and thus cross over one another and must be electrically insulated. Three types of failures which frequently occur during the fabrication of LCD displays are failed data line scanner stages, open data lines and shorts between select lines and data lines. For this reason, there is a need for a circuit for testing for such flaws which is reliable, fast and inexpensive. The present invention fulfills this need by the provision of an integrated circuit which is fabricated onto the display device substrate and which substantially reduces the number of test lines needed for the display device.

CROSS REFERENCE TO RELATED APPLICATIONS

This invention can be used with the invention described in application Ser. No. 660,274 filed concurrently herewith by Antoine DuPont and Dora Plus and entitled "Redundant Shift Registers For Scanning Devices".

This invention can be used with the invention described in application Ser. No. 660,273 filed concurrently herewith by Dora Plus and Antoine DuPont and titled "Design And Test Methodology For Redundant Shift Registers".

SUMMARY

A test circuit for testing the continuity of the data lines of a liquid crystal display device, for testing the stages of a data line scanner, and for detecting shorts between the data lines and the select lines of the display, includes an output bus having a test line. A plurality of TFT's have conduction paths individually connecting the data lines to the output bus. A shift register sequentially actuates the control electrodes of the TFT's to transfer data signals from the data lines to the test line. The test line is monitored to identify failed data line scanner stages, open data lines and select lines which are shorted to data lines.

BRIEF DESCRIPTION OF THE DRAWINGS

The FIGURE is a preferred embodiment.

DETAILED DESCRIPTION

In the FIGURE, a liquid crystal display 10 includes a data line scanner 11 which provides data signals on a plurality of data lines 12. A select line scanner 13 sequentially voltage biases a plurality of select lines 14. The data lines 12 and select lines 14 are perpendicular and liquid crystal cells, such as 15, are arranged at the crossovers. Switching devices 16, such as thin film transistors (TFT's) are turned on by the biased select lines 14 and the data lines 12 charge the liquid crystal cells 15 to levels determined by the data signals. A redundant select line scanner 13' can also voltage bias select lines 14. Stages of select line scanner 13' which correspond to failed stages of select line scanner 13 are used in lieu of the failed stages.

Three types of failures which frequently arise during fabrication of liquid crystal displays are failed data line scanner stages, open data lines and select lines which are shorted to the data lines at the crossovers. The presence of either of these flaws can result in the rejection of the display device. However, many of the flaws can be corrected if the capability of detecting and locating the flaws is available. The present invention provides this capability.

The data line scanner 11, select line scanner 13 and TFT's 16 are simultaneously fabricated onto an insulative substrate. With the invention, test transistors 17, which preferably are TFT's, are simultaneously fabricated on the substrate along with the scanners 11, 13 and the TFT's 16. The conduction path of one TFT 17 is arranged between each of the data lines 12 and an output bus 18. In the preferred embodiment shown, output bus 18 is divided into six segments, 18-1 through 18-6. A shift register 19, preferably consists of a number of sections 19-1 through 19-6, equal in number to the number of segments in output bus 18. The output lines 20 of shift register 19 are individually connected to the control electrodes of the TFT's 17. Test lines 21-1 through 21-6 connect the bus segments 18-1 through 18-6, respectively to a monitor 22. Input lines 23 through 27 are used to provide the biasing voltage, input signal and clock signals to shift register 19. The operational speed of shift register 19 is increased, and the loading of data scanner 11 is decreased by segmenting bus 18.

Select line scanners 13 and 13' each include an extra stage 28 and 28' respectively. The output signals of stages 28 and 28' are connected to monitor 22 by test lines 24 and 24' respectively. The extra stages 28 and 28' are used to test the operation of the select line scanners 13, and 13', respectively and to isolate the last select line 14 of the display from the test lines 24 and 24'. The select line scanners 13 and 13' are separately tested prior to the continuity testing, short testing, and data line scanner testing described herein by running the select line scanner in the normal operating manner and noting monitor 22. A failed stage is indicated by the absence of an input signal to monitor 22 from the test line 24 of the scanner having the defective stage. Separate equipment and methods as described in applications Ser. No. 660,274 and Ser. No. 660,273, fully referenced hereinabove, can be used to identify the failed stage.

In operation, shift registers 19 sequentially turn on the transistors 17 as data line scanner 11 provides data signals on the data lines 12. Only one of the TFT's 17 is on at a time in each register segment and therefore the data lines 12 are sequentially coupled to monitor 22 through the individual TFT's 17 and a segment of bus 18. Accordingly, the absence of a voltage on one of the test lines 21-1 through 21-6 indicates a failure of continuity of one of the data lines 12. The failed data line can be accurately identified by synchronizing the operation of data line scanner 11 and shift register 19 and by keeping track of the sequential actuation of the TFT's 17. Monitor 22 therefore preferably includes computer controlled measuring equipment, which is within the purview of those skilled in the art. Defective data line scanner stages are identified because no stage subsequent to the defective stage will provide a signal on a data line 12.

The presence of a short between one of the data lines 12 and one of the select lines 14 is detected by utilizing select line scanner 13 to sequentially actuate the select lines 14 while sequentially turning on TFT's 17. A short between a select line and a data line will result in one of the test lines 21-1 through 21-6 applying a voltage to monitor 22. Again, by synchronizing the scanning of the select lines 14 and by tracking the actuation of the TFT's 17, the identities of shorted data lines and select lines can be precisely determined.

The preferred embodiment includes the six output lines 21, the two test lines 24, 24' and the five input lines 23-27, a total of thirteen lines. This is a very substantial reduction in the number of test lines needed to directly test the data lines 12 individually, which would require a separate test line for each column of liquid crystal cells, 1,440 lines for the example given above.

What is claimed is:

1. In a liquid crystal display having a matrix of cells arranged in rows and columns, a plurality of data lines for applying data signals from a data line scanner to said columns of cells and a plurality of select lines for applying select signals from a select line scanner to said rows of cells, a test circuit for continuity testing said data lines, for identifying defective stages of said data line scanner, and for detecting shorts between said data lines and said select lines, said test circuit comprising:

an output bus having at least one test line;

a plurality of solid state devices having conduction paths individually connecting said data lines to said output bus, each of said solid state devices having a control electrode;

means for sequentially actuating said control electrodes to transfer said data signals from said data lines to said test line; and means for monitoring said test line to identify open data lines, defective data line stages, and shorted select lines.

2. The test circuit of claim 1 wherein said output bus is divided into a plurality of segments, each of said segments having a test line, and wherein said means for sequentially scanning includes a shift register divided into an equal number of sections whereby each of said sections actuates one of said segments.

3. The test circuit of claim 2 wherein said select line scanner includes a test stage for isolating said select line scanner from said test circuit, said test stage having a test output line for verifying the operation of said select line scanner.

4. The test circuit of claim 3 wherein said solid state devices are thin film transistors.

5. A method of testing a liquid crystal display having a matrix of cells arranged in rows and columns, said display having a data line scanner for applying data signals to a plurality of data lines which individually apply data signals to said columns, said display also having a select line scanner for applying select signals to a plurality of select lines which individually apply select signals to said rows, said method including the steps of:

arranging individual solid state devices between each of said data lines and a bus;

sequentially actuating said solid state devices while applying data signals to said data lines and monitoring the voltage on said bus to identify open data lines by the absence of voltage on said bus.

6. The method of claim 5 further including the step of testing for shorts between said data lines and said select lines by sequentially actuating said solid state devices while applying select signals to said select lines while monitoring said bus to detect the presence of a short by the presence of a voltage on said bus.

7. The method of claim 6 further including the step of dividing said bus into a plurality of segments and individually monitoring said segments.

8. The method of claim 7 wherein said solid state devices are thin film transistors.

9. The method of claim 5 further including the step of dividing said bus into a plurality of segments and individually monitoring said segments.

* * * * *